United States Patent
Xu et al.

(10) Patent No.: US 9,117,838 B2
(45) Date of Patent: Aug. 25, 2015

(54) ASYMMETRICALLY RECESSED HIGH-POWER AND HIGH-GAIN ULTRA-SHORT GATE HEMT DEVICE

(71) Applicant: BAE Systems Information and Electronic Systems Integration Inc., Nashua, NH (US)

(72) Inventors: Dong Xu, Nashua, NH (US); Xiaoping S. Yang, Nashua, NH (US); Wendell Kong, Hollis, NH (US); Lee M. Mohnkern, Bedford, NH (US); Phillip M. Smith, Hollis, NH (US); Pane-chane Chao, Nashua, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 13/860,190

(22) Filed: Apr. 10, 2013

(65) Prior Publication Data
US 2013/0230951 A1     Sep. 5, 2013

Related U.S. Application Data

(62) Division of application No. 12/462,515, filed on Aug. 5, 2009, now Pat. No. 8,445,941.

(60) Provisional application No. 61/180,993, filed on May 26, 2009.

(51) Int. Cl.
*H01L 29/66*     (2006.01)
*H01L 29/778*    (2006.01)

(52) U.S. Cl.
CPC ...... *H01L 29/66431* (2013.01); *H01L 29/7784* (2013.01); *H01L 29/7785* (2013.01)

(58) Field of Classification Search
CPC ............ H01L 29/1608; H01L 29/7783; H01L 29/7787
USPC ........................ 257/183, 183.1, 194, E21.403, 257/E29.246; 438/47, 309
See application file for complete search history.

(56) References Cited

U.S. PATENT DOCUMENTS 5,262,660 A      11/1993   Streit et al.
7,285,807 B2 *   10/2007   Brar et al. ..................... 257/194
(Continued)

FOREIGN PATENT DOCUMENTS

EP         0 803 912         10/1997
EP         803912 A1 *       10/1997    ............ H01L 29/812

OTHER PUBLICATIONS

Dong Xu et al., 50-nm Metamorphic High Electron-Mobility Transistors with High Gain and High Breakdown Voltages, IEE Electron Device Letters, vol. 30, No. 8, Aug. 2009.
(Continued)

*Primary Examiner* — Lynne Gurley
*Assistant Examiner* — Vernon P Webb
(74) *Attorney, Agent, or Firm* — Daniel J. Long

(57) ABSTRACT

A high-power and high-gain ultra-short gate HEMT device has exceptional gain and an exceptionally high breakdown voltage provided by an increased width asymmetric recess for the gate electrode, by a composite channel layer including a thin indium arsenide layer embedded in the indium gallium arsenide channel layer and by double doping through the use of an additional silicon doping spike. The improved transistor has an exceptional 14 dB gain at 110 GHz and exhibits an exceptionally high 3.5-4 V breakdown voltage, thus to provide high gain, high-power and ultra-high frequency in an ultra-short gate device.

7 Claims, 11 Drawing Sheets

(56) References Cited

U.S. PATENT DOCUMENTS

| | | |
|---|---|---|
| 2003/0010999 A1 | 1/2003 | Tanabe |
| 2003/0122152 A1* | 7/2003 | Kim et al. ............... 257/194 |
| 2006/0102931 A1 | 5/2006 | Kopley et al. |
| 2007/0145415 A1 | 6/2007 | Inoue et al. |
| 2009/0078966 A1 | 3/2009 | Asai et al. |

OTHER PUBLICATIONS

Dong Xu et al., High-Performance 50 Nm Metamorphic High Electron-Mobility Transistors With High Breakdown Voltages, International Journal of High Speed Electronics and Systems.

* cited by examiner

ASYMMETRICALLY RECESSED HIGH-POWER AND HIGH-GAIN ULTRA-SHORT GATE HEMT DEVICE

CROSS-REFERENCE TO RELATED APPLICATIONS

This Application is a divisional of U.S. application Ser. No. 12/462,515 filed Aug. 5, 2009 and claims rights under 35 USC §119(e) from U.S. Application Ser. No. 61/180,993 filed May 26, 2009, the contents of which are incorporated herein, by reference.

FIELD OF THE INVENTION

This invention relates to HEMT devices and more particularly to the provision of an ultra-high-gain high-power high-electron-mobility transistor operating at ultra-high frequencies.

BACKGROUND OF THE INVENTION

InP-based high electron-mobility transistors (HEMT) and GaAs-based metamorphtc electron-mobility transistors (MHEMT) with indium-rich channel designs are well known for their outstanding low noise as is disclosed in M. Schlectweg et al, 11 $^{th}$ GaAs Syrap., Munich, Germany, 2003 and high gain performance as is disclosed in D. Xu et al, IEEE Electron Device Lett., vol. 26, pp. 4-9, 2008, as a result of the superior transport properties associated with the InAIAs/In-GaAs heterostructures. However, this materials system also limits the power performance of the HEMT because, of its low breakdown and enhanced impact ionization. This problem becomes increasingly critical as the gate length is reduced to below 0.1 μm while the channel indium content is increased to boost gain for ultra-high-frequency operation. A need, therefore, exists for a way to address the low breakdown issue of ultra-short-gate high-gain HEMTs with indium-rich channel materials.

More particularly, it is desirable to improve the high frequency performance of InP-based HEMTs. For high frequency applications in excess of 300 GHz there are emerging sub-millimeter applications, for instance for transmitters operating at 340 GHz to enable imaging such as for instance for detection of explosives.

The conventional approach to enhancing high frequency performance including the incorporation of increased indium content in InGaAs channel layers and the reduction of gate length normally results in a reduction in breakdown voltages which limits the high power applications for such transistors. The use of wide band gap channel materials such as InP or mAsP can increase the breakdown voltage but only at the expense of the degradation of other important characteristics such as drain current and transconductance, making It difficult to generate sufficient gain at these ultra-high frequencies.

SUMMARY OF INVENTION

In order to achieve high frequency, high power performance the subject invention utilizes a composite channel layer using a thin InAs layer embedded in IxiGaAs, a double-side doping scheme, and an asymmetric recess for the gate electrode to produce enough gain at ultra-high frequencies while at the same time maximizing breakdown voltage.

The subject invention shows maximum stable gain of 14,2 dB at 110 GHz and produces enough gain for operating at 340 GHz while increasing off-state and on-state breakdown voltages to 9V and 3.5V respectively.

It is noted that for transistor amplifiers, gain drops as frequency increases such that high power devices designed for low frequency use, e.g. GaAs-based or GaN-based HEMTs, cannot deliver high power at the higher frequencies.

InP-based HEMTs have been utilized for their high performance at high frequencies. This is due to the superior transport properties associated with the InAlAs/lnGaAs heterostructures including high saturation velocity, high mobility, and high sheet earner density in the channel layer. All these make the InP-based HEMTs very attractive for high frequency applications.

In order to get these devices to operate at higher and higher frequencies, the gate size has to be made smaller and smaller, typically on the order of a tenth of a micron. However, such devices still cannot produce enough gain at high frequencies such as 340 GHz. While higher gain can be realized with even smaller gates on InAlAs/lnGaAs heterostructures based on an InP substrate, the use of the smaller gate is counterproductive to better power performance because the smaller gate degrades breakdown voltages of the devices due to the enhanced impact ionization.

Note that the low breakdown voltage is also related to the band gap of the material system. The small band gap of the InGaAs channel material leading to the superior transport properties and excellent gain performance also causes the low breakdown voltages. Thus this fundamental performance conflict needs to be addressed if one wants to have an InP-based HEMT device operating at high frequencies for high power applications.

In order to provide a high power and high gain InP-based HEMT device, the first solution is to increase the recess width for the gate electrode on the drain side, in one embodiment to 300 nanometers. The recess width boosts the gain of the transistor so that it can have enough gain at ultra-high frequencies. The second result of increasing the recess width is to lower the electric field between the gate and the drain. This is the way that the breakdown voltage is made higher.

Prior to the subject invention, the recess width was typically set at 50 nanometers on the drain side tor applications at W band or beyond. However, it has turned out that an asymmetric 300 nanometer recess on the drain side provides an increased gain at high frequency, with the asymmetry reducing the parasitic resistance that make transistors too lossy. It is a finding of the subject invention that even with the wide recess width one can nonetheless maintain very low parasitic resistance, making the device only slightly more lossy than would be the case with a narrow recess channel.

The reason that the wide recess channel can still maintain a low parasitic resistance is that only the width of drain side of the recess groove is increased, which means that the gate contact is closer to the source than it is to the drain. The gate contact is typically 30 to 50 nanometers from the source end of the recess groove, whereas it is between 250 and 300 nanometers from the drain end of the groove.

Thus, the asymmetrical design of the recess groove increases the breakdown voltage of the device, with only a slight degradation in other transistor characteristics such as drain current and transconductance.

The second portion of the subject invention is to provide a composite channel of InGaAs having a very thin intermediate layer of InAs.

The InAs channel layer is made very thin, on the order of 2 nm out of 6 nm of the channel thickness. It has been found that this specific design has a substantial beneficial for HEMT devices in terms of high gain and enhanced on-state breakdown voltage.

Note the InAs layer has a very special physical property. First, its electron mass is very low and is lower than InGaAs. Another important physical property is the spacing between the gamma valley where most of the electrons populate and the L valley is larger in InAs than it is in InGaAs. The electrons populating in gamma valley have the best transport properties which means the electrons populating in the gamma valley will move faster, which is desirable for high frequency operation. However, what happens if one applies an electric field to the device is that some of the electrons move to the next valley, namely the L valley, which has worse transport properties compared to that of the gamma valley. It is thus desirable to populate and retain more electrons in the gamma valley, since with the more electrons in the gamma valley, the better the operation of the transistor will be.

InAs thus has an advantage because the spacing between the gamma valley and the L valley is larger than the InGaAs layer. Thus, the use of the InAs makes it more difficult for electrons to be transported to the less efficient L valley. In this way the addition of the thin layer of InAs not only gives better transport properties, it also yields these better transport properties without degrading the high breakdown voltage allowing the transistor to operate under high voltage, or high bias conditions.

Thus, it is a finding of the subject invention that the use of the very thin layer of InAs provides faster transistors under the high bias conditions achievable through the aforementioned, increased recess width.

The third phenomenon which causes the subject transistor to operate so well at higher frequencies is so-called double-doping. At the outset it will be noted that double-doping has no influence on the aforementioned band structure. However, the addition of a bottom doping layer changes the electric field in the way that the output conductance will be lower. This means that the output resistance will be higher which helps boost gain.

There is one parameter called voltage gain that Is the ratio between the transconductance and output conductance. The higher this ratio, the higher the voltage gain will be. It is therefore most desirable to have the higher transconductance which translates to amplification power while simultaneously having lower output conductance, This phenomenon is provided by a bottom doping silicon plane or spike which lowers the output conductance to help boost gain.

To explain the double-doping, starting with a substrate, buffer layers are deposited, over which a lower barrier layer is deposited. The first spike or plane of silicon is deposited on this lower barrier layer. The silicon plane serves as donor source, in which each silicon atom contributes one electron which is transferred through a spacer to the channel layer to form the two-dimensional electron gas.

While the channel is usually provided with an upper silicon spike doping layer that provides electrons that proceed down through a non-doped spacing layer to the channel, in the subject invention the lower silicon spike layer also provides electrons to the channel to improve gain.

Note that a gate layer is deposited on top of the upper spike which is deposited on top of the spacer above the channel layer. The gate layer is terminated with a cap layer.

The subject system thus provides doping on the top and bottom sides of the channel, whereas most transistors only have doping from the top side of the channel.

As will be appreciated, the subject technique offers the first use of double-doping for the small gate used for high frequency operation. However, adding extra doping in the channel will oftentimes cause problems for small channel devices. This is because as one adds another doping layer it means that one will degrade the aspect ratio which is determined by the ratio between the gate length and the spacing between the gate and the two-dimensional electron gas in the channel. Note that by adding the second doping under the channel one shifts the heavy center of the two-dimensional electron gas away from the gate.

If one does not plan the gate and recess dimensions properly it will be hard to control the channel which means that the transconductance will suffer and one will not see the gain occasioned by lowering the output conductance with the additional doping layer.

As will be seen, the output conductance will be lower by adding the second doping layer. If one is very careful and scales the device properly one will not see much deterioration in the aspect ratio. Thus, one needs to vertically scale the device properly by adjusting the recess to not only increase its width, but also to place the bottom of the gate electrode close enough to the channel so that the original aspect ratio is maintained. This means that one must dig out the portion of a widened recess to move the bottom of the gate electrode closer to the channel layer. Basically one has to increase the depth of the recess to provide that the gate contact is closer to the channel The layer between the gate electrode and the channel is the gate layer. However, if the gate layer is too thin this can result in quantum tunneling.

There is therefore a balance between the recess design and the double-doping scenario such that gate length, lateral scaling, vertical scaling and channel design operate in concert to provide for the much improved performance of the high electron mobility transistor.

The net result of the above is that one can fabricate an HEMT with an ultra-high gain at 110 GHz and is capable of operating at 340 GHz and beyond with much enhanced breakdown performance. Even though operation at 340 GHz is made possible by using conventional technology, the biasing voltage typically needs to be at 1V or under to avoid breakdown failure. In one embodiment, the on-state breakdown voltage was found to be about 3.5 volts, thus allowing the device to be operated at a much higher bias condition to deliver much more power at ultra-high frequencies.

BRIEF DESCRIPTION OF THE DRAWINGS

These and other features of the subject invention will be better understood in connection with the Detailed Description, in conjunction with the Drawings, of which.

DETAILED DESCRIPTION

Figure 1:
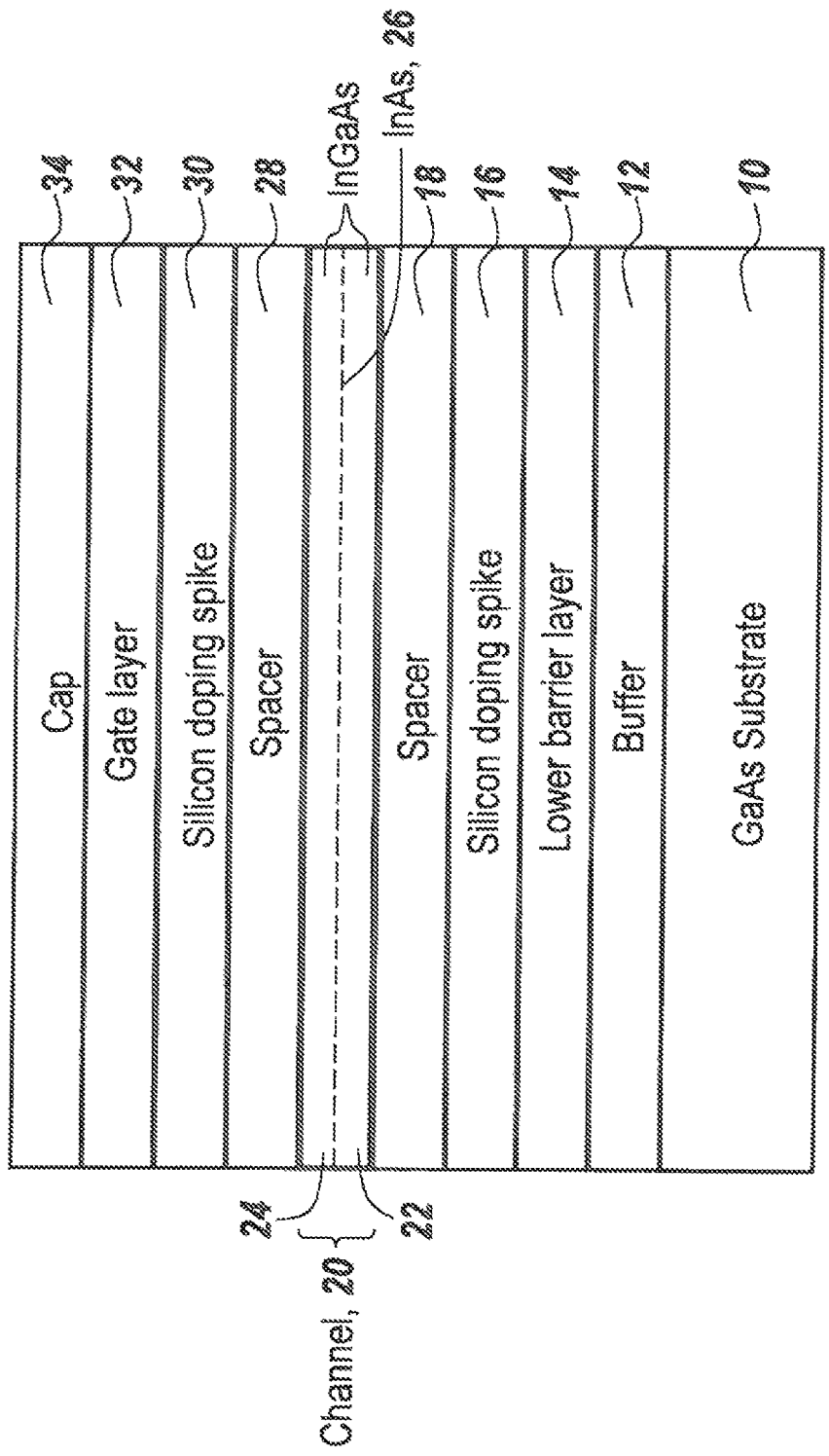
FIG. 1 shows an. epitaxial layer structure in a preferred embodiment of the subject invention.

Referring now to FIG. 1, in the subject invention the epitaxial structure which leads to the improved device includes a gallium, arsenide substrate 10 on top of which is provided a buffer 12, in one form an InAlAs buffer. On top of the buffer is deposited a lower barrier layer 14.

The first of the two silicon doping spike layers is .shown as a lower silicon doping spike layer 16 on top of which is a spacer 18, in one embodiment an InAlAs spacer.

The composite channel 20 includes a bottom indium gallium arsenide layer 22 and an upper indium gallium arsenide layer 24 having an embedded indium arsenide layer 26 which is relatively thin compared to the overall dimensions of the channel layer, in one embodiment the indium arsenide layer is 2 nanometers in thickness, with the indium gallium arsenide layers surround it each being of 2 nanometers in thickness, making the overall channel 6 nanometers thick.

On top of channel 20 is a spacer 28, in one embodiment an InAlAs spacer, and an upper silicon doping spike 30 placed on top of spacer 28.

Gate layer 32 lies on top of upper silicon doping spike layer 30, Topping the gate layer is an indium gallium arsenide cap 34.

It will be appreciated that this epitaxial structure leads to the improved high breakdown high gain performance of the high electron mobility transistor, both through the double-doping described above in. which the lower silicon plane and the upper silicon plane contribute to the doping of the channel, and because of the composite channel with the embedded thin indium arsenide embedded layer.

Figure 2:
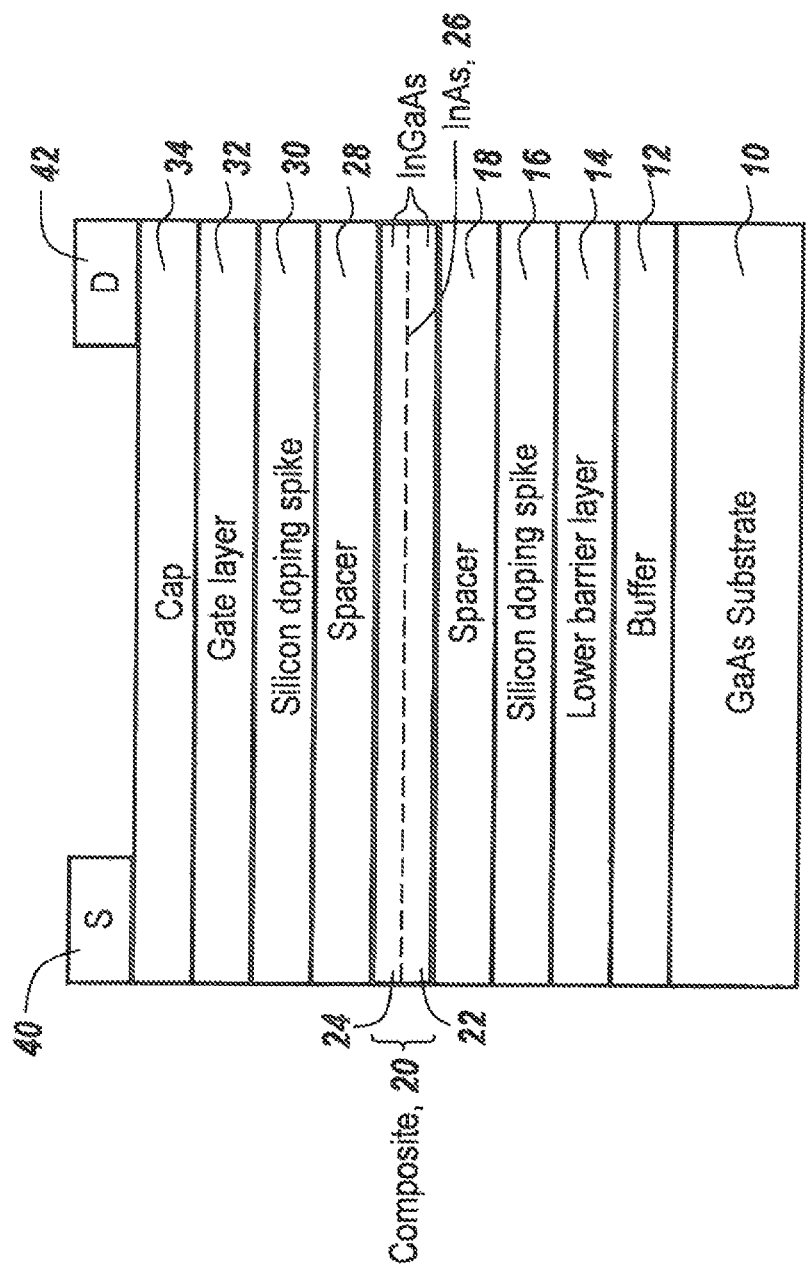
FIGS. 2 and 3 are cross sectional views showing respectively the first and second steps in fabricating a preferred embodiment of the subject HEMT having the asymmetrically-recessed gate groove.

Referring now to FIG. 2, the overall procedure to fabricate the asymmetrically recessed HEMT starts with mesa isolation and definition of ohmic contact for both, source electrode 40 and drain electrode 42.

Gallium arsenide substrate 10 is provided with a buffer layer 12 (also known as "metamorphic buffer") that functions as transitioning the lattice constant from that of GaAs to that of InP, on top of which is the high indium InAlAs/InGaAs heterostructure normally grown with lattice match. The use of metamorphic technology allows the use of cheaper and larger GaAs substrates while retaining the high quality of InAlAs/InGaAs heterostructure.

On top of buffer 12 is a lower barrier layer 14 which functions as the lower confinement layer of the two-dimensional electron gas.

On top of lower buffer layer .14 is the lower silicon spike layer 16, function of which is provide additional electrons to the channel layer. On top of the silicon doping spike layer is a spacer 18 which functions to spatially separate the electrons in the channel layer from the Ionized donors in the Si spike, leading to the greatly enhanced electron mobility in the channel.

As indicated above, on top of spacer 18 is the composite channel 20, on top of which is formed a spacer 28 that functions as the same way as spacer 18.

On top of spacer 28 is the upper silicon doping layer 30 which functions as a major electron supply layer for the channel, followed by the deposition of a gate layer 32 that functions as the layer where the gate metal is deposited, forming a Schottky junction for channel control.

On top of the gate layer is an indium gallium arsenide cap layer 34 which forms a good ohmic contact for the source and drain electrodes.

As can be seen in FIG. 2 source electrode 40 and drain electrode 42 are patterned on top of cap layer 34.

Figure 3:
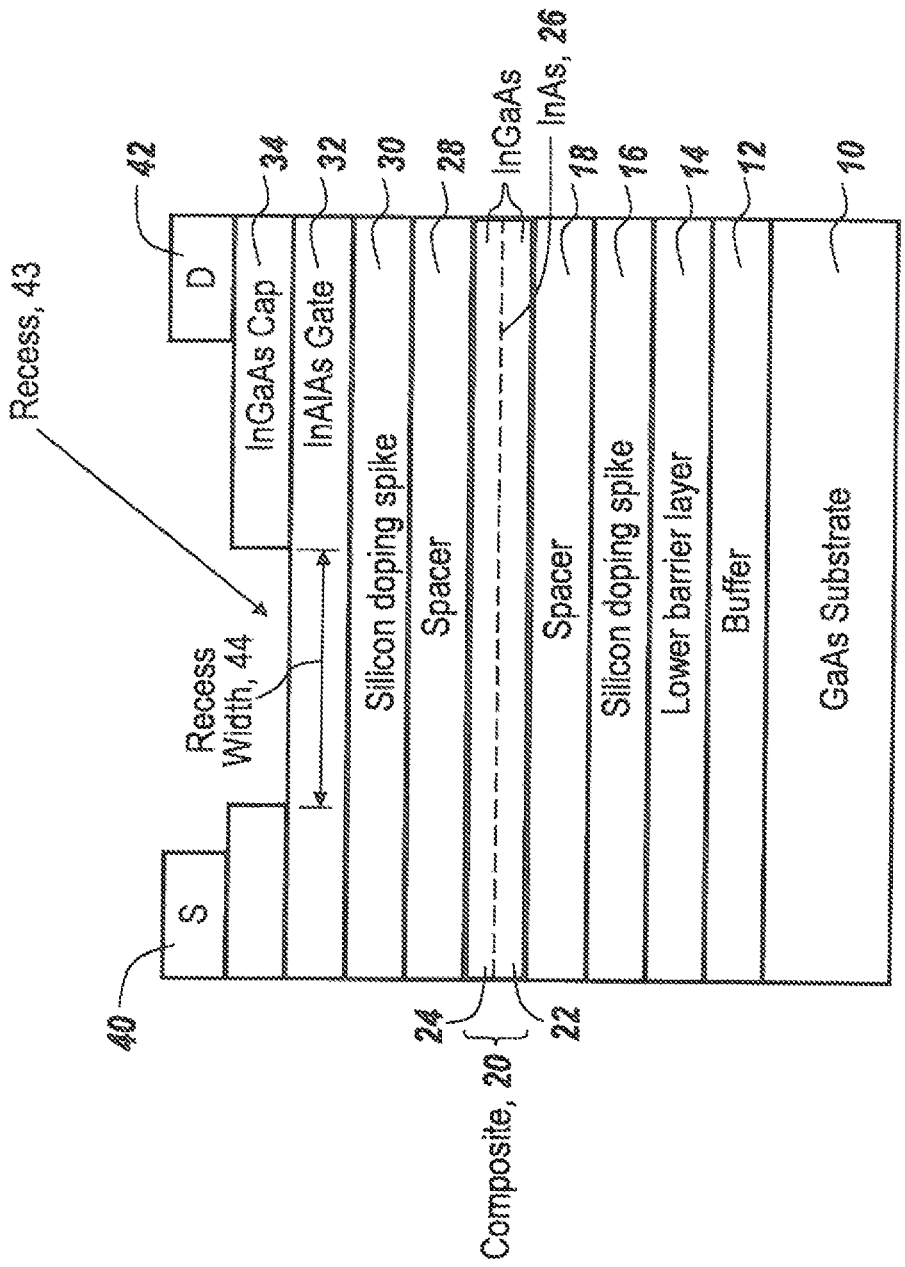

Referring to FIG. 3, a recess groove 43 is defined in cap layer 34 that has a recess width which is to be enlarged over conventional designs for applications at ultra-high frequency.

Figure 4:
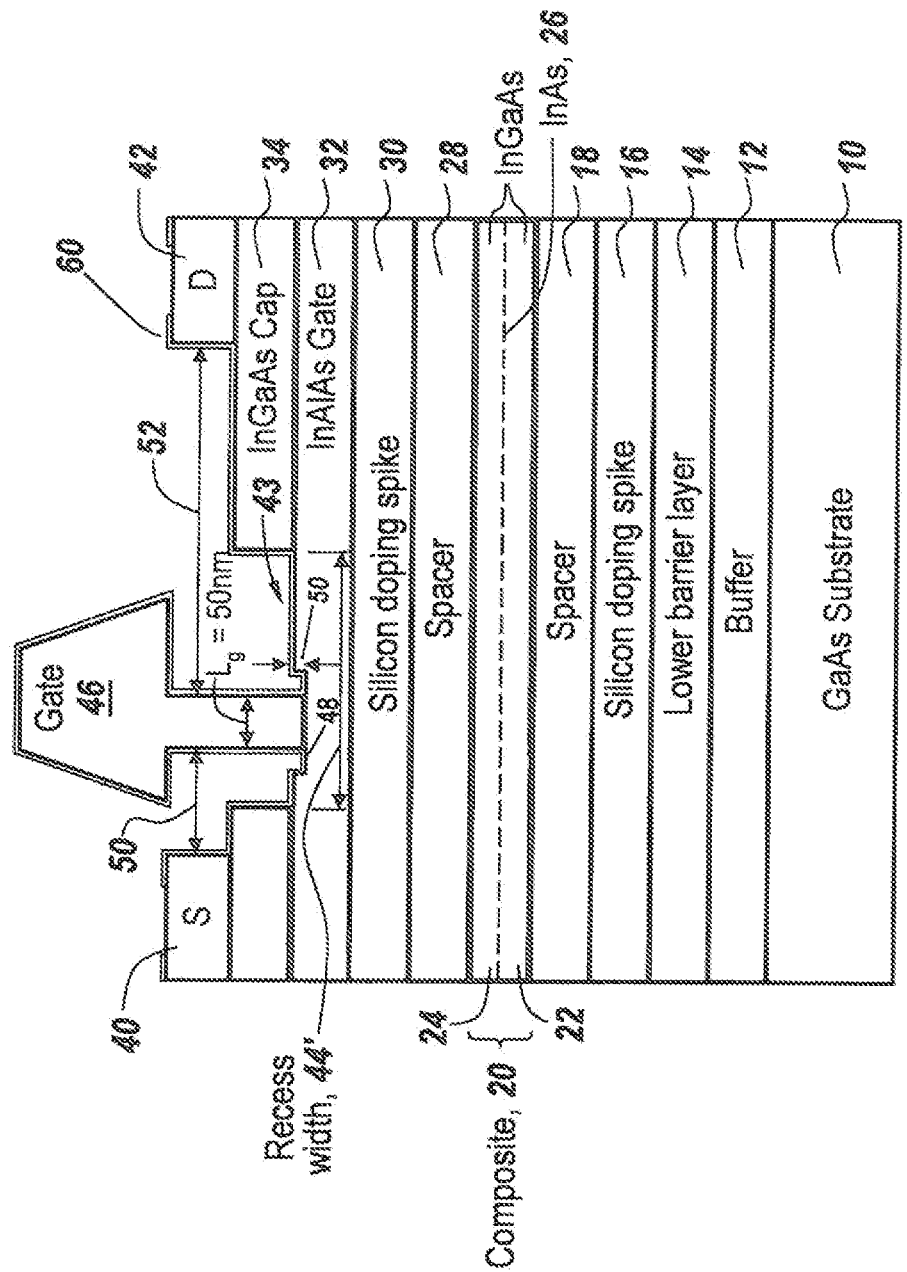
FIG. 4 is a diagrammatic illustration of a 50-nm MHEMT fabricated with double-sided doping, a composite channel layer and an asymmetrical recess.

Referring to FIG. 4, the recess width 44 Is enlarged as shown at 44' such that when a gate electrode 46 is placed on gate layer 32, the gate electrode which has a footprint Lg=50 nm is offset towards the source such that the distance from the source end of the groove to the gate electrode is much smaller than the distance from the gate electrode to the drain end of the groove. In one embodiment with a recess channel width of 400 nm, the gate footprint is placed around 40 nm away from the source end of the recess groove and 400 nm from the source electrode itself. Here the distance of the gate from the source electrode is indicated by double-ended arrow 50, whereas the distance from the gate electrode to the drain electrode is illustrated by double-ended arrow 52 and is on the order of 500-1500 nm. As can be seen, the asymmetric recess 43 places the gate closer to the source than it does to the drain to effectuate a lowering of electric field at the gate-drain region for improvement in breakdown voltage, output conductance and feedback capacitance, and at the same time minimizes the increase in parasitic resistance as a result of the use of large gate recess groove.

Because of the double-sided doping gate layer 32 is provided with a dug out or recessed portion 48, whose depth 50 is used to scale the HEMT vertically to retain the high aspect ratio, which is the key parameter for excellent device performance, Note the epitaxial structures for MHEMT fabrication were grown by molecular beam epitaxy (MBE) on semi-insulating GaAs substrates. The structures consist of a graded InAlAs metamorphic buffer, a high-indium InGaAs channel, an i-In-AlAs gate layer and a highly-doped InGaAs cap layer.

In the subject invention two channel designs were explored. Reference Structure A has an 80% InGaAs channel with a silicon planar doping only above the channel. Modified Structure B has a composite channel containing the thin InAs layer, with silicon planar doping both above and below the channel.

For Structure A and Structure B, the typical room temperature sheet carrier density was around $3.3 \times 10^{12}$ and $3.8 \times 10^{12}$ cm$^{-2}$, respectively. Correspondingly, the room temperature electron mobility was around 11500 and 12000 cm$^2$/Vs. It is worth noting that modified Structure B had both higher sheet carrier density and electron mobility than Structure A.

More particularly, FIG. 1 thus shows the novel epitaxial layer structure optimized for high-power and high-gain applications, featuring an InAs-containing component embedded in the InGaAs channel and a double-sided-doping scheme with silicon dopant spikes under and above the channel. FIGS. 2-4 show the overall procedure to fabricate the asymmetrically-recessed HEMTs. The fabrication process starts with the mesa isolation and definition of ohmic contact for both source and drain electrodes. The asymmetric gate recess is then implemented with a separate electron beam lithography step, which defines resist openings with the total recess groove size up to 400 nm. To minimize the increase of source resistance as a result of the wider recess, which degrades the transconductance, the recess openings are pattered with an offset towards the source side of the channel. After the removal of the highly-doped cap layer, a two-step exposure and developing process based on a tri-layer electron beam resist scheme is performed to define T-gates or Γ-gates, with footprint sizes range from 25-90 nm, resulting in an excellent gate metal liftoff.

The wide gate recess significantly improves the breakdown behavior of the 50-nm MHEMTs. The two-terminal off-state breakdown voltage, BV$_{off}$, is defined as the gate-drain voltage at which a gate current of 1 mA/mm is reached with the source floating; the three-terminal on-state breakdown, BV$_{on}$, is defined as the drain bias V$_{ds}$ at which the gate current reaches 1 mA/mm at the gate bias V$_{gs}$ for peak transconductance g$_m$.

Figure 7:
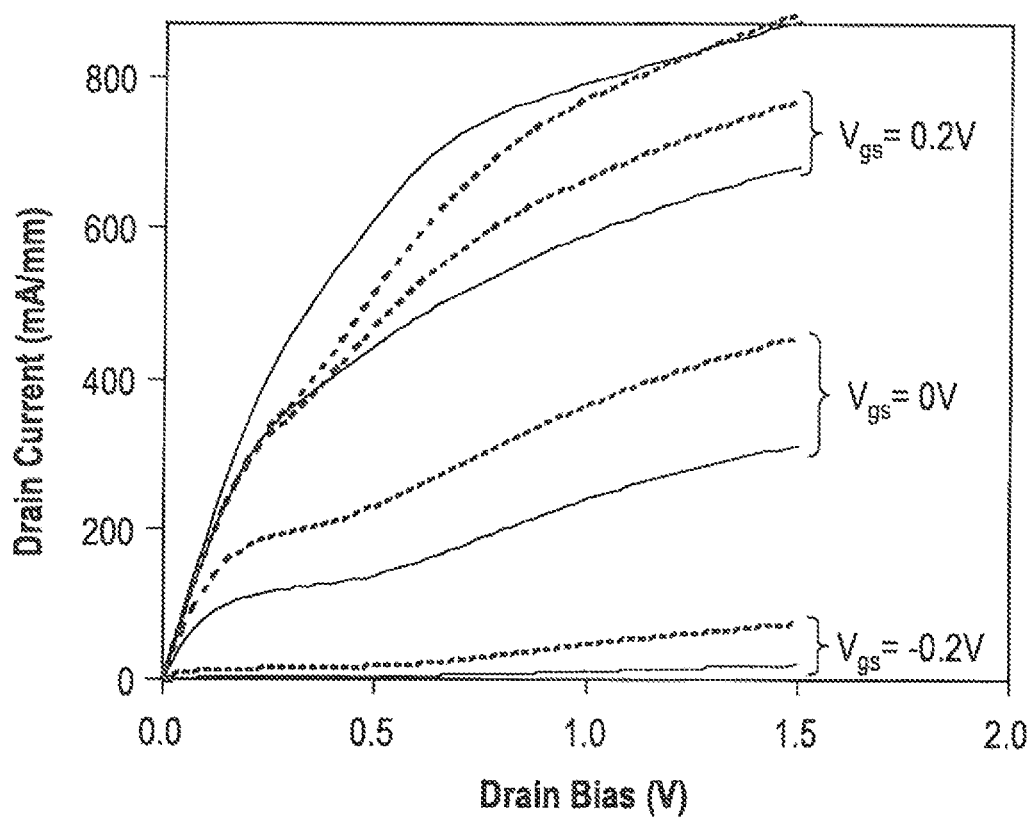
FIG. 7 is a graph of the output characteristics for the identical 50-nm MHEMT based on Structure A before (dashed lines) and after (solid lines) silicon nitride passivation layer deposition, with the gate bias $V_{gs}$ for both top curves of 0.4 V and the $V_{gs}$ step of –0.2 V.

As shown in FIG. 7, the collapse of drain current I$_{ds}$ at low drain bias V$_{ds}$ (dashed lines) results from the small gate-to-channel separation for short channel effect suppression as well as from the adopted wide gate recess for enhancing breakdown voltage and gain. The deposition of a thin layer of silicon nitride, however, boosts the maximum I$_{ds}$ (at gate bias V$_{gs}$ of 0.4V) by 15-40% at V$_{ds}$ from 0.25-0.50V. When V$_{ds}$ is higher than 0.5V, one can notice a slightly lower for the passivated device under the same V$_{gs}$ of 0.2V or lower. This is due to 75 mV shift of pinch-off voltage, related to a slight gate, sinking during passivation but. is not related to the change of the surface conditions beside the gate. The optimized passivation process provides an added freedom for scaling both vertically and laterally without significantly compromising the drain current as well as the transconductance.

Figure 8:
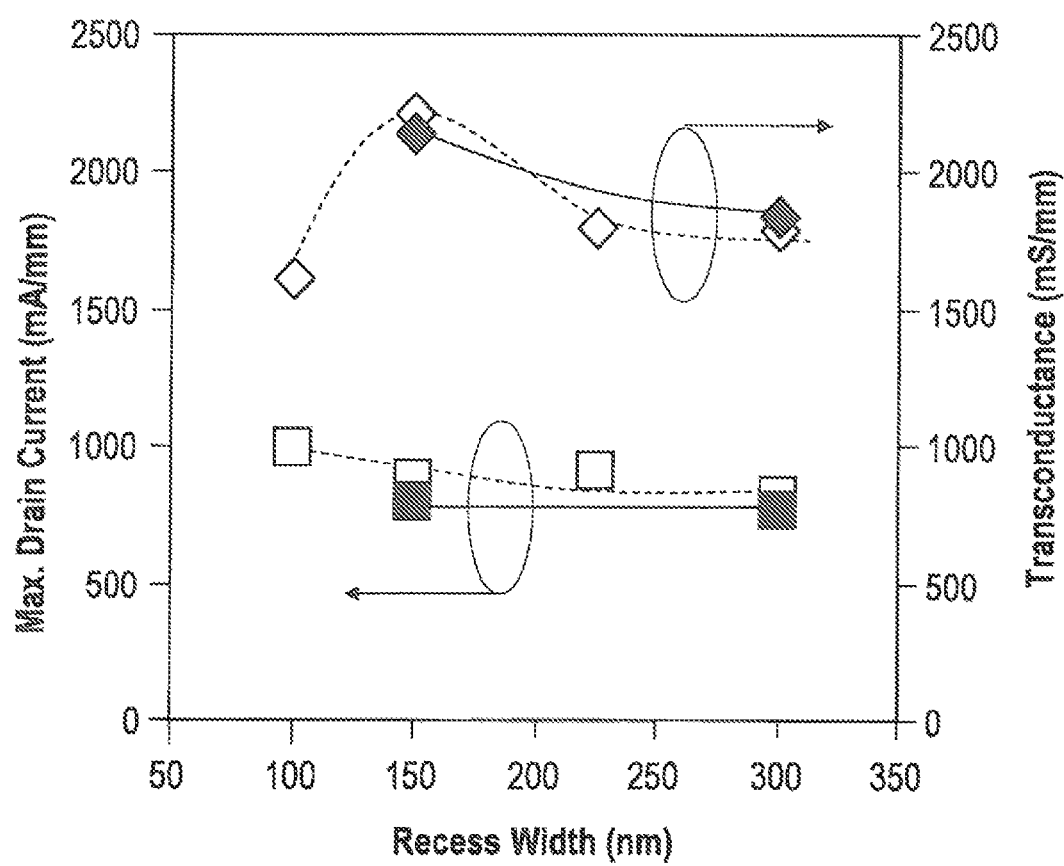
FIG. 8 is a graph of the peak $g_m$ (diamonds) and maximum drain current $I_{max}$ (squares) for 50-nm MHEMTs fabricated on a reference Structure A (open symbols) and a modified Structure B (solid symbols) with different recess groove widths.

FIG. 8 summarizes the maximum drain current I$_{max}$ and the peak g$_m$ of the fabricated MHEMTs with various gate L$_{rec}$ on both Structures A and B, While the highest-peak g$_m$ is achieved at a L$_{rec}$ of 150 nm for Structure A, the further extension of the gate recess at the drain side does not lead to substantial reduction in the g$_m$. This is because the peak g$_m$ is largely determined by the source resistance and the gate-to-channel separation, both of which remain unchanged. The lower g$_m$ for the device with 100-nm L$_{rec}$ is related to the misalignment between the recess and gate definition. As expected, the I$_{max}$ shows a monotonic decrease as the recess groove widens due to the increased channel resistance. A similar but less dramatic trend of I$_{max}$ and peak g$_m$ as a function of L$_{rec}$ has also been observed on structure B.

Figure 9:
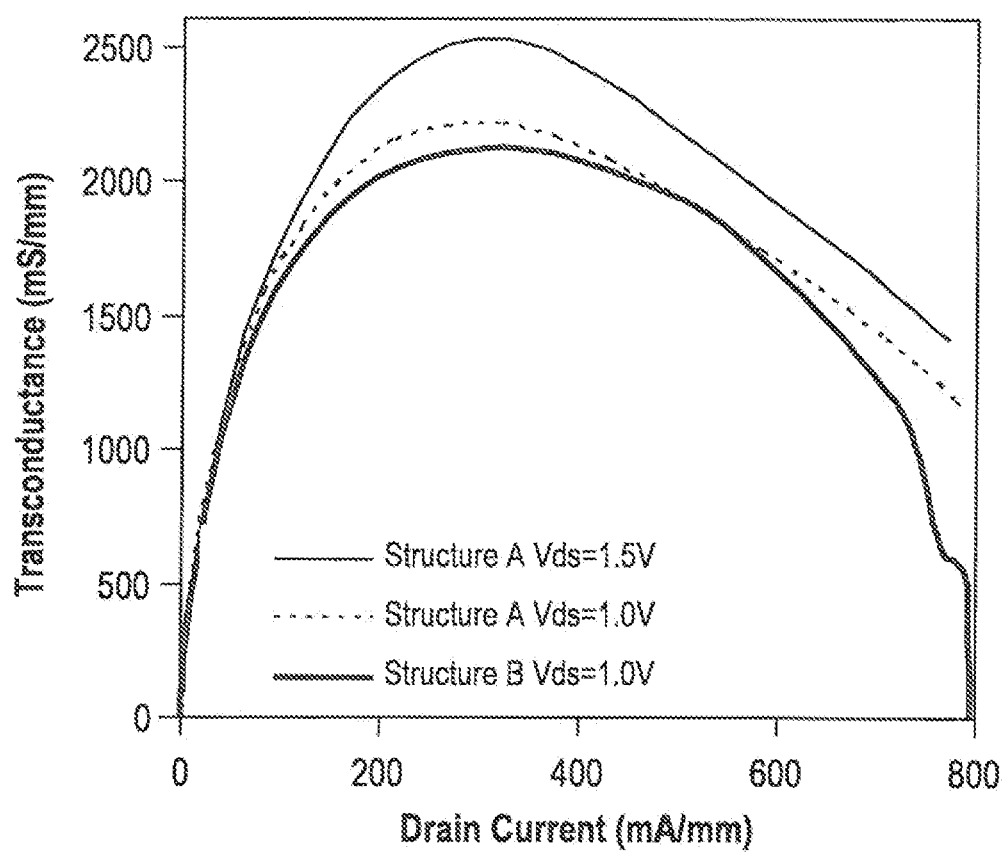
FIG. 9 is a graph showing the dependence of transconductance on the drain current for 50-nm MHEMTs fabricated on reference Structures A (thin dashed line measured at drain bias $V_{ds}=1.0V$ and thin solid line measured at $V_{ds}=1.5V$) and optimized epistructure B (thick solid line measured $V_{ds}=1.0V$) with a recess groove width of 150 nm, the lower drain current of devices on Structure B due to the smaller gate-to-channel separation.

FIG. 9 also discloses the difference in g$_m$ characteristics between the two structures: Structure A shows a higher g$_m$ of 2200 mS/mm in comparison with the 2100 mS/mm of structure B at a V$_{ds}$ of 1 V, primarily due to its smaller gate-to-channel distance with the single-sided doping. The g$_m$ of structure A also has a higher V$_{ds}$ dependence and its peak g$_m$ is as high as 2500 mS/mm at a V$_{ds}$ of 1.5 V. Overall, the use of a wide gate recess does not introduce a significant reduction in I$_{max}$ or g$_m$ due to the passivation. This allows focusing on tailoring recess structure for breakdown improvement.

Figure 5:
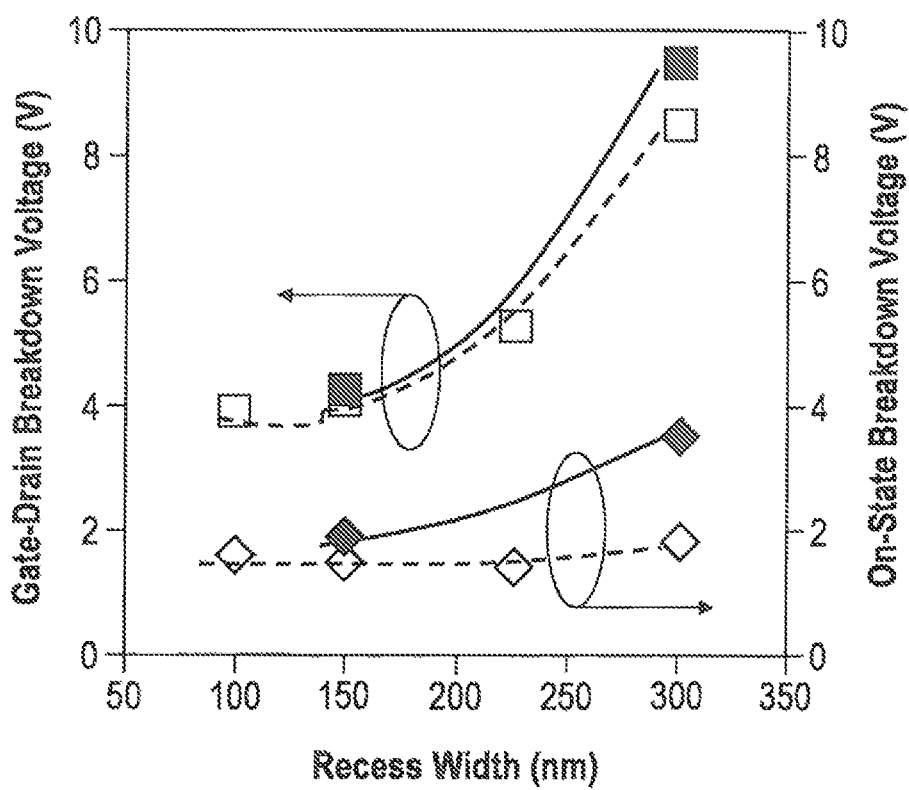
FIG. 5 is a graph showing both the off-state $BV_{off}$ (squares) and on-state breakdown voltage $BV_{on}$ (diamonds) for 50-nm MHEMTs fabricated on a reference Structure A (open symbols), and a modified Structure B (solid symbols), with different recess groove widths.

On reference Structure A, it can be observed from FIG. 5, for the device with a 300-nm spacing between the gate and the drain end of the recess groove. L$_{rec}$ was found to have a BV$_{off}$ approximately 4 V higher as compared to a device with a 150-nm L$_{rec}$. A similar trend is also observed for devices on modified Structure B. This is because the BV$_{off}$ is essentially governed by the extension of the depletion area between the gate and the drain, which is defined by the recess groove on the drain side. As for BV$_{on}$, the devices on Structure A are less sensitive to the L$_{rec}$ variation. However, a substantially higher BV$_{on}$ of about 3.5-4 V can be achieved on Structure B for devices with a 300-nm wide recess groove, which is attributed to its composite channel design that reduces the impact ionization in the channel layers.

Figure 6:
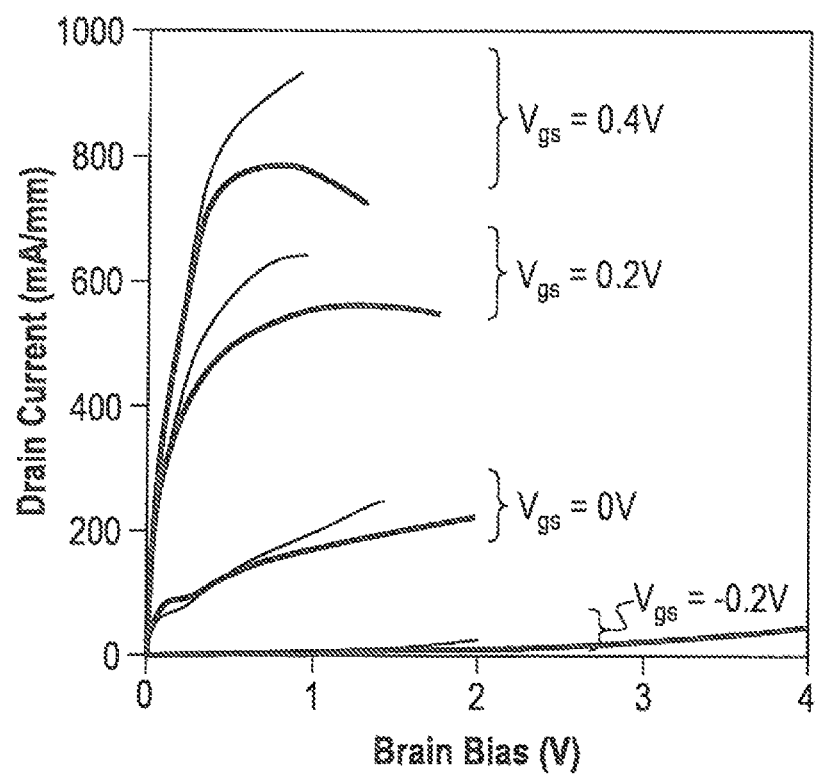
FIG. 6 is a graph showing Output characteristics for 50-nm MHEMTs fabricated on structure B with recess groove widths of 150 nm (thin lines) and 300 nm (thick lines), with the gate bias $V_{gs}$ for the top curve being 0.4 V, and the $V_{gs}$ step being –0.2 V.

FIG. 6 shows the excellent output characteristics of an MHEMT with enhanced breakdown voltages using the optimized epitaxial design of Structure B and an optimized 300-nm asymmetrical gate recess groove: greater than 9V BV$_{off}$, 3.5 V BV$_{on}$, about 800 mA/mm I$_{max}$ at a V$_{ds}$ of 1, and 1.9 S/mm peak g$_m$ at a V$_{ds}$ ranging from 1-2 V.

On~wafer S-parameter measurement over the frequency of 0.5-110 GHz was performed on 2×15 μm microstrip devices with L$_{rec}$ of 300 nm, because wide recess devices have better maximum stable gain MSG due to a lower feedback capacitance and a lower output conductance g$_o$.

Figure 10:
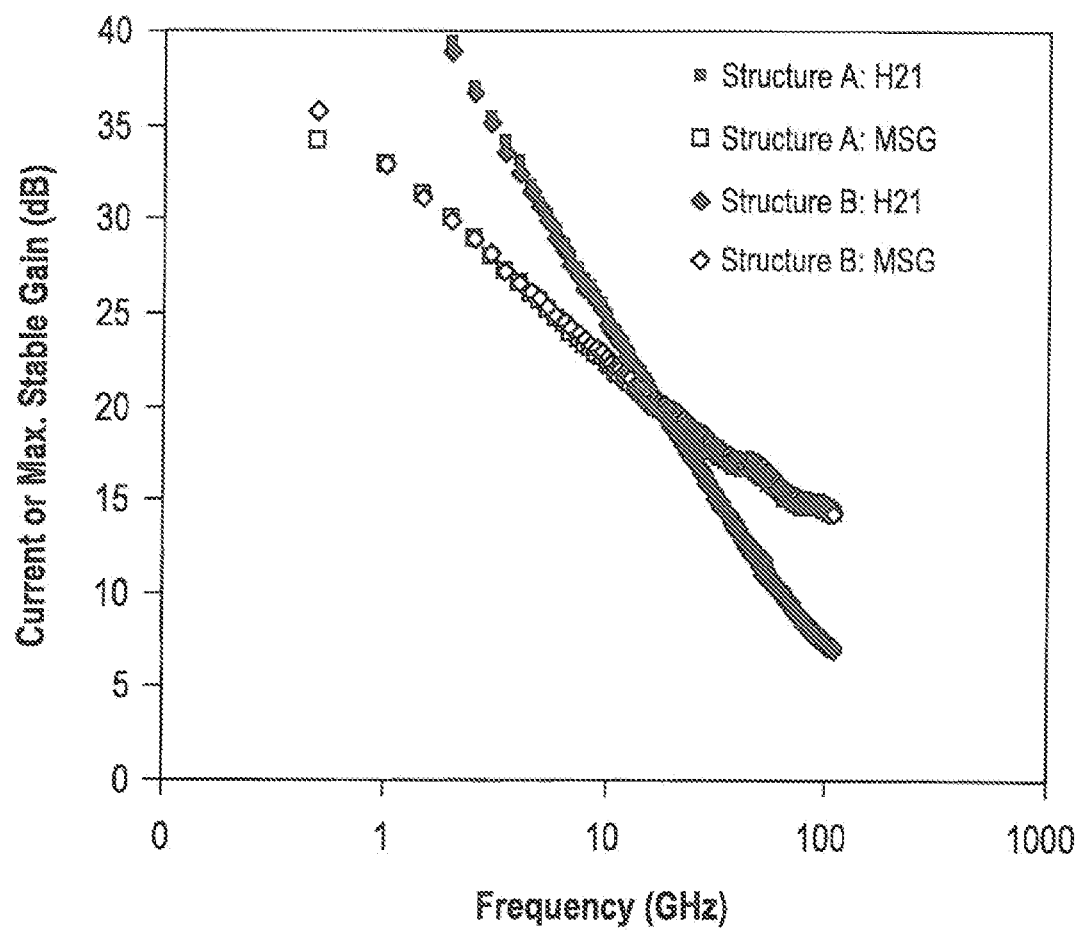
FIG. 10 is a graph of current gain $h_{21}$ (thin line) and maximum stable gain MSG (thick line) calculated from measured S-parameters for 50-nm MHEMT with a 300-nm recess groove fabricated on Structure A (squares) and Structure B (diamonds), with the 2×15 μm devices biased at $V_{ds}=1.2$ V and $I_{ds}=9$ mA; and, FIG. 11 is a summary graph of power gain and on-state breakdown voltage of the state-of-the-art HEMT technologies reported to date, with the power gain in this figure referring to MSG, except for the point for IEMN, which is the maximum unilateral gain (MUG) measured at 110 GHz, noting the 14+dB gain using the subject technology.
Figure 11:
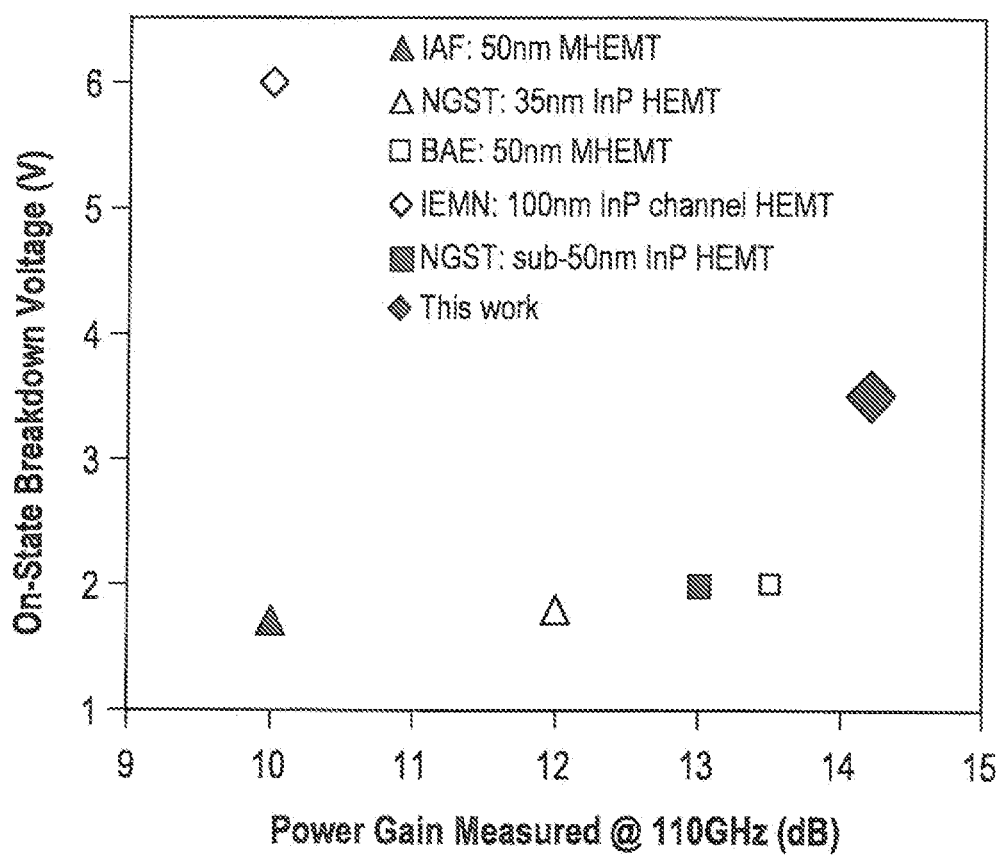

FIG. 10 shows the current gain h$_{21}$ and MSG of 50-nm devices on Structures A and B, biased at a V$_{ds}$ of 1.2 V and I$_{ds}$ of 9 mA. The 0.7 dB MSG improvement over the unpassivated device is due primarily to the improved device characteristics including kink effects by passivation. It can be noted that Structure B does not produce higher h$_{21}$ or MSG at the above bias conditions. However, it leads to an unprecedented HEMT simultaneously having a record high MSG of 14.2 dB at 110 GHz and a high BV$_{on}$ of 3.5 V, as shown in FIG. 11. Furthermore, the g$_o$ of this device is lowered to 50 mS/mm at a V$_{ds}$ higher than 1.75 V, boosting g$_m$/g$_o$ to a record of 80, indicating an even higher gain and potentially improved power performance as well.

In summary, 50-nm MHEMTs with InAs-inserted channels have demonstrated state-of-the-art performance, including 1.9 S/mm g$_m$ and 800 mA/mm I$_{max}$ a drain bias of 1 V, 9V BV$_{off}$, approximately 3.5V BV$_{on}$ and 14.2-dB MSG at 110 GHz. These results are attributed to the optimized high indium content channel design, short gate length, the use of an asymmetric recess and the passivation process that gives the device designer sufficient flexibility to scale the devices both vertically and laterally.

While the present Invention has been described in connection with the preferred embodiments of the various figures, it is to be understood that other similar embodiments may be used or modifications or additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. A method of providing an ultra-short gate, high electron-mobility transistor with ultra-high frequency and high-power performance, comprising the step of:
providing the high electron-mobility transistor with an increased width asymmetric recess groove for the agate electrode thereof, a composite channel layer having an upper indium gallium arsenide layer, a lower indium gallium arsenide layer and a single embedded thin indium arsenide layer between the upper indium gallium arsenide layer and the lower indium gallium arsenide layer and the composite layer having a double-sided doping scheme, and wherein the transistor has an ultra-short gate electrode characterized by a gain in excess of 14db at 110 GHz. whereby the power gain and the breakdown voltage of the transistor are increased.

2. The method of claim 1, wherein the transistor has a cap layer into which the recess is formed, and further including recessing the gate layer beneath the recess by an amount to counteract the deterioration of the aspect ratio with the use of double-sided doping.

3. The method of claim 1, wherein the indium arsenide layer, is on the order of 2 nm in thickness.

4. The method of claim 3, wherein the upper indium gallium arsenide layer and the lower indium gallium arsenide layer between which the indium arsenide layer is embedded are each 2 nm in thickness, yielding a composite channel layer thickness of 6 nm.

5. The method of claim 1, wherein the asymmetric recess places the gate electrode of the transistor closer to the source of the transistor than to the drain of the transistor.

6. The method of claim 5, wherein the gate electrode of the transistor is between 30-50 nm from the source end of the recess groove and wherein the gate electrode of the transistor is spaced from the drain end of the recess groove by 250-300 nm, thereby to improve the breakdown voltage and gain of the transistor.

7. The method of claim 1, wherein the transistor is provided with a thin silicon nitride film passivation layer.

* * * * *